(12) United States Patent
Wang et al.

(10) Patent No.: US 11,695,079 B2
(45) Date of Patent: Jul. 4, 2023

(54) OXIDE THIN FILM TRANSISTOR, METHOD FOR MANUFACTURING THE SAME AND DISPLAY DEVICE

(71) Applicant: BOE TECHNOLOGY GROUP CO., LTD., Beijing (CN)

(72) Inventors: Lizhong Wang, Beijing (CN); Tianmin Zhou, Beijing (CN); Hehe Hu, Beijing (CN); Xiaochun Xu, Beijing (CN); Nianqi Yao, Beijing (CN); Dapeng Xue, Beijing (CN); Shuilang Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 71 days.

(21) Appl. No.: 17/356,167

(22) Filed: Jun. 23, 2021

(65) Prior Publication Data

US 2022/0131009 A1    Apr. 28, 2022

(30) Foreign Application Priority Data

Oct. 28, 2020    (CN) .......................... 202011170073.7

(51) Int. Cl.
| | | |
|---|---|---|
| *H01L 27/00* | (2006.01) | |
| *H01L 29/00* | (2006.01) | |
| *H01L 29/786* | (2006.01) | |
| *H01L 27/12* | (2006.01) | |
| *H01L 29/66* | (2006.01) | |

(52) U.S. Cl.
CPC ........ *H01L 29/7869* (2013.01); *H01L 27/127* (2013.01); *H01L 27/1225* (2013.01); *H01L 29/66969* (2013.01)

(58) Field of Classification Search
CPC ... H01L 27/127; H01L 27/1225; H01L 27/32; H01L 29/7869; H01L 29/66969; H01L 29/78696
See application file for complete search history.

(56) References Cited

U.S. PATENT DOCUMENTS

| | | | |
|---|---|---|---|
| 9,171,960 B2* | 10/2015 | Hong | H01L 21/823807 |
| 9,379,138 B2* | 6/2016 | Ikeda | H01L 27/14609 |
| 9,691,905 B2* | 6/2017 | Ito | H01L 29/78693 |
| 9,812,581 B2* | 11/2017 | Kitakado | H01L 29/45 |
| 10,403,361 B2* | 9/2019 | Widjaja | H01L 29/7881 |

(Continued)

*Primary Examiner* — Nikolay K Yushin
(74) *Attorney, Agent, or Firm* — Muncy, Geissler, Olds & Lowe, P.C.

(57) ABSTRACT

An oxide thin film transistor includes: a gate electrode, a metal oxide active layer and a source-drain metal layer, which are on a base substrate. The metal oxide active layer includes a first metal oxide layer and a second metal oxide layer stacked on the first metal oxide layer in a direction away from the base substrate; the first metal oxide layer is a carrier transport layer; the second metal oxide layer is a carrier isolation layer; an electron transfer rate of the carrier transport layer is greater than an electron transfer rate of the carrier isolation layer. The first metal oxide layer includes a primary surface facing toward the base substrate and a primary surface away from the base substrate; the first metal oxide layer further includes a lateral surface around the primary surfaces; the second metal oxide layer covers the lateral surface of the first metal oxide layer.

20 Claims, 4 Drawing Sheets

(56) References Cited

U.S. PATENT DOCUMENTS

| | | | |
|---|---|---|---|
| 2014/0210835 A1* | 7/2014 | Hong | G09G 3/20 |
| | | | 345/530 |
| 2015/0021598 A1* | 1/2015 | Ikeda | H01L 29/7869 |
| | | | 257/43 |
| 2016/0013325 A1* | 1/2016 | Kitakado | H01L 29/78633 |
| | | | 257/43 |
| 2016/0372606 A1* | 12/2016 | Ito | H01L 29/78696 |
| 2019/0189212 A1* | 6/2019 | Widjaja | G11C 13/003 |

* cited by examiner

OXIDE THIN FILM TRANSISTOR, METHOD FOR MANUFACTURING THE SAME AND DISPLAY DEVICE

CROSS-REFERENCE TO RELATED APPLICATIONS

The present application claims a priority of the Chinese patent application No. 202011170073.7 filed on Oct. 28, 2020, which is incorporated herein in its entirety.

TECHNICAL FIELD

The present application relates to the field of display technology, and in particular to an oxide thin film transistor and a method for manufacturing the same and a display device.

BACKGROUND

In the related art, mobility and stability of an oxide thin film transistor are improved via a design of multilayer oxide thin film transistor. Specifically, an active layer is designed to have multiple layers with high mobility and high impedance. However, during the research process, the inventors of the present application found that the multilayer oxide thin-film transistor has at least problems that poor reliability of the active layer affects display effect.

SUMMARY

In a first aspect, embodiments of the present application provide an oxide thin-film transistor, including: a gate electrode, a metal oxide active layer and a source-drain metal layer, which are on a base substrate. The metal oxide active layer includes a first metal oxide layer and a second metal oxide layer stacked on the first metal oxide layer in a direction away from the base substrate; the first metal oxide layer is a carrier transport layer; the second metal oxide layer is a carrier isolation layer; and an electron transfer rate of the carrier transport layer is greater than an electron transfer rate of the carrier isolation layer. The first metal oxide layer includes a primary surface facing toward the base substrate and a primary surface away from the base substrate; the first metal oxide layer further includes a lateral surface around the primary surfaces; and the second metal oxide layer covers the lateral surface of the first metal oxide layer.

In some embodiments, the source-drain metal layer is at a side of the second metal oxide layer away from the first metal oxide layer; a via hole or a blind hole is defined in the second metal oxide layer; the via hole or the blind hole extends in a direction perpendicular to the base substrate; and the source-drain metal layer is electrically coupled to the first metal oxide layer through the via hole or the blind hole.

In some embodiments, a material of the first metal oxide layer includes a metal oxide in an amorphous state; and a material of the second metal oxide layer includes a metal oxide in a crystalline state.

In some embodiments, the material of the second metal oxide layer has a crystallization peak in a range of 29° to 32° in an X-ray diffraction spectrogram.

In some embodiments, the material of the first metal oxide layer and the material of the second metal oxide layer include indium gallium zinc oxide (IGZO).

In some embodiments, the first metal oxide layer has a band gap of 2.3 to 2.8 eV; and the second metal oxide layer has a band gap of 2.8 to 3.5 eV.

In some embodiments, the active layer further includes a third metal oxide layer; the third metal oxide layer is at a side of the first metal oxide layer away from the second metal oxide layer; a range of an orthographic projection of the first metal oxide layer onto the third metal oxide layer is less than or equal to a range of the third metal oxide layer; the third metal oxide layer has the same material and degree of crystallization as the second metal oxide layer.

In some embodiments, the active layer further includes a fourth metal oxide layer; the fourth metal oxide layer is at a side of the second metal oxide layer away from the first metal oxide layer; and the fourth metal oxide layer covers a lateral surface of the second metal oxide layer in a direction perpendicular to the base substrate; a material of the fourth metal oxide layer includes IGZO, a degree of crystallization of the material of the fourth metal oxide layer is greater than a degree of crystallization of the material of the second metal oxide layer; and the fourth metal oxide layer has a band gap of 3.0 to 3.5 eV.

In some embodiments, an atomic percentage of indium in a metal material of the fourth metal oxide layer is smaller than an atomic percentage of indium in a metal material of the second metal oxide layer.

In some embodiments, an atomic number ratio of indium, gallium and zinc in the metal material of the fourth metal oxide layer is 2:5-8:5-8.

In some embodiments, a total thickness of the first metal oxide layer and the second metal oxide layer is not greater than 100 nanometers; and a thickness of the second metal oxide layer is greater than a thickness of the first metal oxide layer.

In some embodiments, the source-drain metal layer includes a first sub-layer, a second sub-layer and a third sub-layer which are stacked on each other; the third sub-layer is electrically coupled to the first metal oxide layer.

In a second aspect, embodiments of the present application further provide an oxide thin film transistor, including: a gate electrode, a metal oxide active layer and a source-drain metal layer, which are on a base substrate. The metal oxide active layer includes a first metal oxide layer and a second metal oxide layer stacked on the first metal oxide layer in a direction away from the base substrate; the first metal oxide layer is a carrier transport layer; the second metal oxide layer is a carrier isolation layer; and an electron transfer rate of the carrier transport layer is greater than an electron transfer rate of the carrier isolation layer. The source-drain metal layer is at a side of the second metal oxide layer away from the first metal oxide layer; a via hole or a blind hole is defined in the second metal oxide layer; the via hole or the blind hole extends in a direction perpendicular to the base substrate; and the source-drain metal layer is electrically coupled to the first metal oxide layer through the via hole or the blind hole.

In some embodiments, a total thickness of the first metal oxide layer and the second metal oxide layer is not greater than 100 nanometers; and a thickness of the second metal oxide layer is greater than a thickness of the first metal oxide layer.

In some embodiments, the source-drain metal layer includes a first sub-layer, a second sub-layer and a third sub-layer which are stacked on each other; the third sub-layer is electrically coupled to the first metal oxide layer through the via hole or the blind hole.

In a third aspect, embodiments of the present application further provide a display device including the oxide thin-film transistor according to any one of the first aspect or the second aspect.

In a fourth aspect, embodiments of the present application further provide a method of manufacturing an oxide thin film transistor, including: a step of fabricating an active layer; a step of fabricating a source-drain metal layer; and a step of fabricating a gate electrode. The step of fabricating the active layer, includes: fabricating a pattern of a first metal oxide layer through a first patterning process with a target mask; and fabricating a pattern of a second metal oxide layer through a second patterning process with the target mask. An electron transfer rate of the first metal oxide layer is greater than an electron transfer rate of the carrier isolation layer; a line width of the first patterning process is greater than a line width of the second patterning process; an exposure time of the first patterning process is less than an exposure time of the second patterning process; and a developing time of the first patterning process is less than a developing time of the second patterning process.

In some embodiments, fabricating the pattern of the first metal oxide layer through the first patterning process with the target mask, and fabricating the pattern of the second metal oxide layer through the second patterning process with the target mask, includes: controlling an etching rate of the first metal oxide layer to be less than an etching rate of the second metal oxide layer.

In some embodiments, the line width of the first patterning process is greater than the line width of the second patterning process by 0.1 to 0.5 microns; and/or, the exposure time of the first patterning process is less than the exposure time of the second patterning process by 30 to 200 milliseconds; and/or, the developing time of the first patterning process is less than the developing time of the second patterning process by 1 to 10 seconds.

By covering the lateral surface of the first metal oxide layer with the second metal oxide layer, a possibility of oxygen in the first metal oxide layer escaping and diffusing through the lateral surface of the first metal oxide layer in the subsequent high temperature process, is reduced, thereby reducing a possibility of the source-drain metal layers being oxidized to form an oxide layer. This helps to avoid an increase in resistance between structures and reduce structural deformation, thereby helping to improve reliability of the metal oxide active layer of the oxide thin film transistor.

BRIEF DESCRIPTION OF THE DRAWINGS

In order to illustrate technical solutions according to embodiments of the present disclosure more clearly, drawings to be used in the description of the embodiments will be described briefly hereinafter. Apparently, the drawings described hereinafter are only some embodiments of the present disclosure, and other drawings may be obtained by those skilled in the art according to those drawings without creative work.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

The embodiments of the present application provide an oxide thin film transistor (abbreviated as oxide TFT) and a method for manufacturing the same and a display device, which can solve the problem that poor reliability of an active layer affects display effect. It should be understood that TFT involved in this embodiment specifically refers to an oxide thin film transistor.

Figure 1:
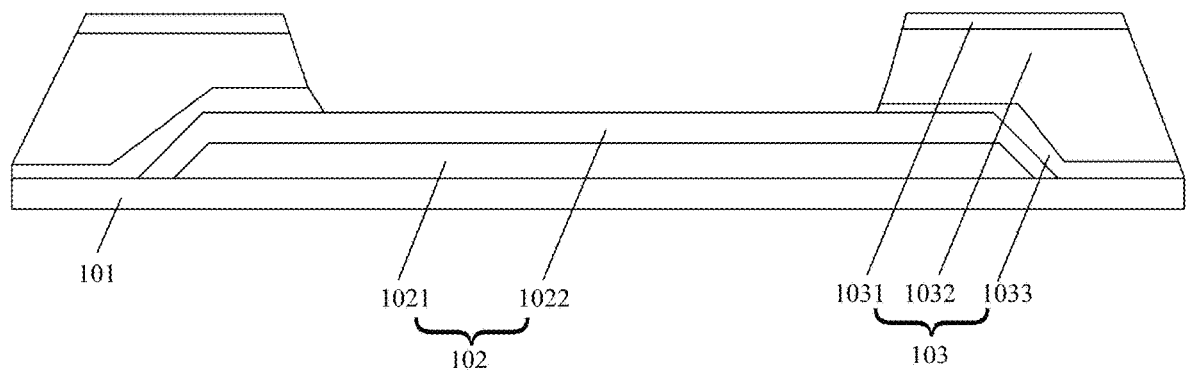
FIG. 1 is a schematic view of an oxide thin film transistor according to an embodiment of the present application.

FIG. 1 is a schematic view of an oxide thin film transistor according to an embodiment of the present application. As shown in FIG. 1, in one embodiment, an oxide thin film transistor is disposed on a base substrate 101, and includes a gate electrode, a metal oxide active layer 102 and a source-drain metal layer 103. The gate electrode, the metal oxide active layer 102 and the source-drain metal layer 103 are disposed on the base substrate 101. The metal oxide active layer 102 includes a first metal oxide layer 1021 and a second metal oxide layer 1022 stacked on the first metal oxide layer 1021 in a direction away from the base substrate 101.

As shown in FIG. 1, in this embodiment, the source-drain metal layer 103 includes a first sub-layer 1031, a second sub-layer 1032 and a third sub-layer 1033. The first sub-layer 1031, the second sub-layer 1032 and the third sub-layer 1033 are stacked on each other. Materials of the first sub-layer 1031 and the third sub-layer 1033 may be niobium-molybdenum alloy, and material of the second sub-layer 1032 may be copper.

The first metal oxide layer 1021, also referred to as a carrier transport layer, is used for carrier transport. The source-drain metal layer 103 includes a source electrode and a drain electrode. During operation of the TFT, carriers flow from the source electrode into the carrier transport layer, travel in the carrier transport layer and then flow to the drain electrode, thereby realizing transmission of an electrical signal.

The second metal oxide layer 1022, also referred to as a carrier isolation layer, is used to isolate carriers to reduce possibilities of the carriers flowing in other directions. The carrier isolation layer is further used to prevent carriers in other structures from flowing into the carrier transport layer, thereby preventing the carriers in other structures from interfering with electrical signals normally transmitted by the carrier transport layer.

An electron transfer rate of the carrier transport layer is greater than an electron transfer rate of the carrier isolation layer. In some optional embodiments, the first metal oxide layer 1021 has a band gap of 2.3 to 2.8 eV, and the second metal oxide layer 1022 has a band gap of 2.8 to 3.5 eV.

Figure 2:
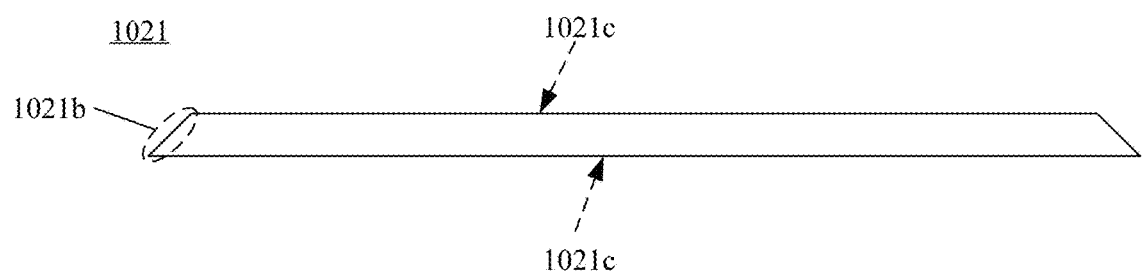
FIG. 2 is a schematic view of a first metal oxide layer according to an embodiment of the present application.

As shown in FIG. 2, the first metal oxide layer 1021 includes a primary surface 1021a (which may also be referred to as a first primary surface) that faces toward the base substrate 101 and a primary surface 1021c (which may also be referred to as a second primary surface) that faces away from the base substrate 101. The first metal oxide layer 1021 further includes a lateral surface 1021b located around the primary surfaces 1021a, 1021c. In the embodiment shown in FIG. 2, the primary surfaces 1021a, 1021c are two opposite surfaces of the first metal oxide layer 1021, and the lateral surface 1021b is located between the primary surfaces 1021a, 1021c. As shown in FIG. 1 and FIG. 2, in this embodiment, the two primary surfaces 1021a, 1021c are an upper surface and a lower surface of the first metal oxide layer 1021 shown in FIG. 1, respectively. The second metal oxide layer 1022 covers the lateral surface 1021b of the first metal oxide layer 1021, thereby preventing the lateral surface 1021b of the first metal oxide layer 1021 from contacting other structures. In the embodiment shown in FIG. 1, the second metal oxide layer 1022 further covers the primary surface 1021c.

Generally, the first metal oxide layer 1021 may be formed by a deposition process. That is, the primary surfaces 1021a, 1021c of the first metal oxide layer 1021 may be formed by a deposition process, so that a density of the primary surfaces 1021a, 1021c is relatively high. The lateral surface 1021b of the first metal oxide layer 1021 is formed by etching a deposited semiconductor layer through a patterning process. A density of the lateral surface 1021b of the first metal oxide layer 1021 is less than the density of the primary surfaces 1021a, 1021c.

A fabrication process of a structure including a TFT, such as a display substrate, usually includes a high temperature annealing process, which may cause oxygen in the first metal oxide layer 1021 to escape and diffuse. Further, the diffused oxygen may react with other structures. For example, the diffused oxygen may react with copper contained in the source-drain metal layer 103 to form an oxide layer which increases resistance between structures, thereby affecting carrier transport. The oxide layer may also cause a change in a thickness of the structure, resulting in deformation of a region near the lateral surface 1021b of the first metal oxide layer 1021.

By covering the lateral surface 1021b of the first metal oxide layer 1021 with the second metal oxide layer 1022, a possibility of oxygen in the first metal oxide layer 1021 escaping and diffusing through the lateral surface 1021b of the first metal oxide layer 1021 in the subsequent high temperature process, is reduced, thereby reducing a possibility of the source-drain metal layers 103 being oxidized to form an oxide layer. This helps to avoid an increase in resistance between structures and reduce structural deformation, thereby helping to improve reliability of the metal oxide active layer 102 of the oxide thin film transistor.

In another embodiment of the present application, a TFT is further provided.

Figure 3:
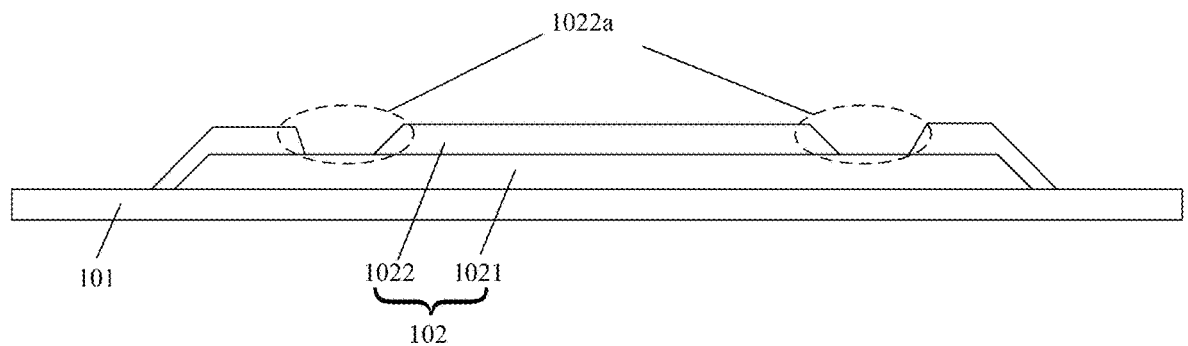
FIG. 3 is a schematic view of a second metal oxide layer with via holes according to an embodiment of the present application.
Figure 5:
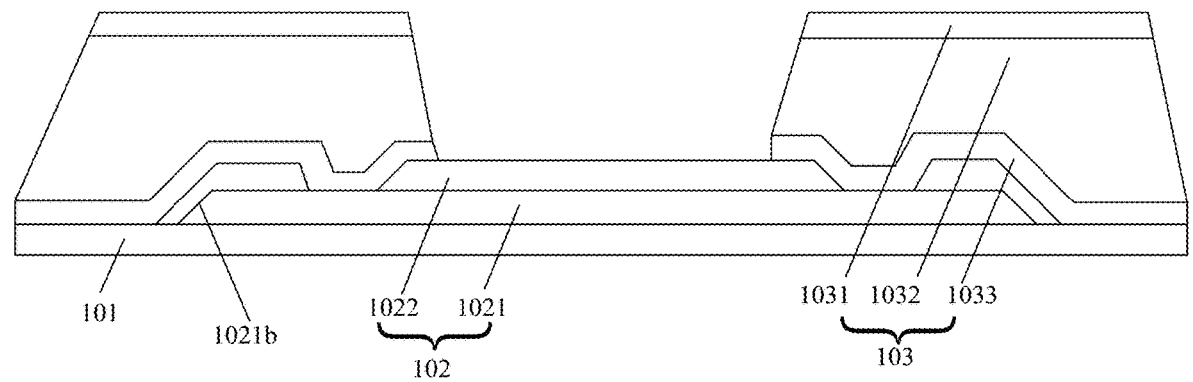
FIG. 5 is another schematic view of an oxide thin film transistor according to an embodiment of the present application.

As shown in FIG. 3, the TFT in this embodiment includes a gate electrode, a metal oxide active layer 102 and a source and drain metal layer 103 (as shown in FIG. 5). The gate electrode, the metal oxide active layer 102 and the source and drain metal layer 103 are located on a base substrate 101. The metal oxide active layer 102 includes a first metal oxide layer 1021 and a second metal oxide layer 1022 stacked on the first metal oxide layer 1021 in a direction away from the base substrate 101. Details of the first metal oxide layer 1021 and the second metal oxide layer 1022 may refer to the foregoing embodiment.

Figure 4:
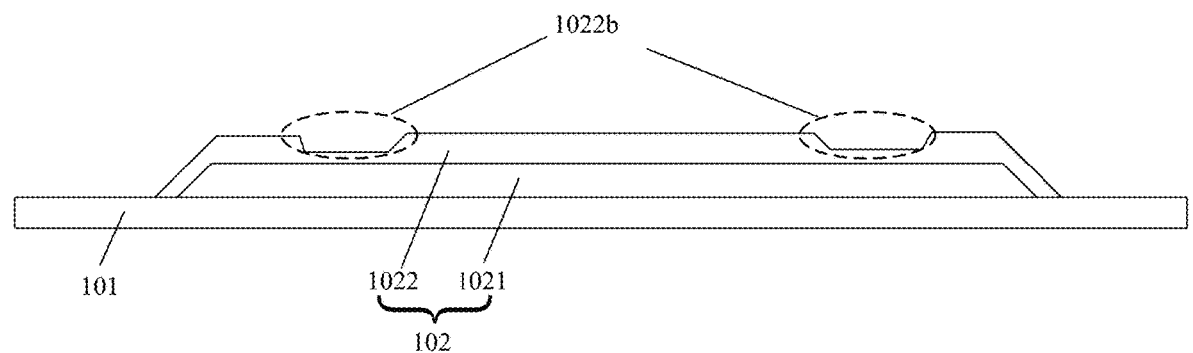
FIG. 4 is a schematic view of a second metal oxide layer with blind holes according to an embodiment of the present application.

As shown in FIG. 3 and FIG. 4, in this embodiment, a via hole 1022a or a blind hole 1022b is defined in the second metal oxide layer 1022, and extends in a direction perpendicular to the base substrate 101. The source-drain metal layer 103 is electrically coupled to the first metal oxide layer 1021 through the via hole 1022a or the blind hole 1022b.

In one embodiment, as shown in FIG. 3, the via hole 1022a defined in the second metal oxide layer 1022 extends through the second metal oxide layer 1022 in the direction perpendicular to the base substrate 101.

In another embodiment, as shown in FIG. 4, the blind hole 1022b defined in the second metal oxide layer 1022 extends only a certain length in the direction perpendicular to the base substrate 101 within the second metal oxide layer 1022 and does not extend through the second metal oxide layer 1022.

It should be understood that the carrier transfer rate of the second metal oxide layer 1022 is relatively low, which may affect the carrier transport, and therefore, in the technical solution of this embodiment, the via hole 1022a or the blind hole 1022b is further defined in the second metal oxide layer 1022.

Referring to FIG. 3 and FIG. 5, in a case that a via hole 1022a is defined in the second metal oxide layer 1022, the source-drain metal layer 103 is in a direct electrical contact with the first metal oxide layer 1021 via the via hole 1022a, thereby reducing a contact resistance between the first metal oxide layer 1021 and the source-drain metal layer 103, which helps to reduce carrier loss and improve transmission effect of electrical signals.

It should be understood that, for the first metal oxide layer 1021, a conductive process may be added to make a region of the first metal oxide layer 1021 in direct electrical contact with the source-drain metal layer 103 conductive. In this way, a portion of the first metal oxide layer 1021 between the source electrode and the drain electrode, actually forms a channel region of the TFT. Regions of the first metal oxide layer 1021 in direct electrical contact with the source electrode and the drain electrode, are conductive regions, which helps to improve carrier transport effect.

Referring to FIG. 3 and FIG. 5, in a case that the via hole 1022a is defined in the second metal oxide layer 1022, a portion of the primary surface of the first metal oxide layer 1021 is exposed, and this portion of the first metal oxide layer 1021 is affected by external environment and then may be conductive to some extent without performing a conductive process. Therefore, exposure of a partial region of the first metal oxide layer 1021 due to the via hole 1022a, does not adversely affect performance of the TFT.

In a case that the blind hole 1022b is defined in the second metal oxide layer 1022, a thickness of the second metal oxide layer 1022 between the first metal oxide layer 1021 and the source-drain metal layer 103, in a region corresponding to the blind hole 1022b, is relatively low, and the resistance thereof is also relatively low, so that the carrier transport effect can also be improved.

Referring to FIG. 2, FIG. 3 and FIG. 5, in another embodiment of the present application, the technical solutions of the foregoing two embodiments are combined.

Specifically, by covering the lateral surface 1021b of the first metal oxide layer 1021 with the second metal oxide layer 1022 and defining a via hole 1022a or a blind hole 1022b in the second metal oxide layer 1022, the protection effect on the lateral surface 1021b of the first metal oxide layer 1021 can be improved, and the resistance between the first metal oxide layer 1021 and the source-drain metal layer 103 can also be reduced, which helps to improve the reliability of the TFT.

It should be understood that the following optional technical solutions of the present application may be applied to any of the foregoing embodiments.

In some optional embodiments, the first metal oxide layer 1021 may be made of a metal oxide in an amorphous state, and the second metal oxide layer 1022 may be made of a metal oxide in a crystalline state.

The metal oxide in the amorphous state has a relatively high carrier density and can provide a better carrier transfer effect. In implementation, the second metal oxide layer 1022 may be recrystallized through a high temperature annealing treatment or the like to increase a degree of crystallization thereof. By forming the first metal oxide layer 1021 with the metal oxide in the amorphous state and forming the second metal oxide layer 1022 with the metal oxide in the crystalline state, it enables the first metal oxide layer 1021 to have a relatively high carrier transfer rate and enables the second metal oxide layer 1022 to have a relatively low carrier transfer rate.

Figure 6:
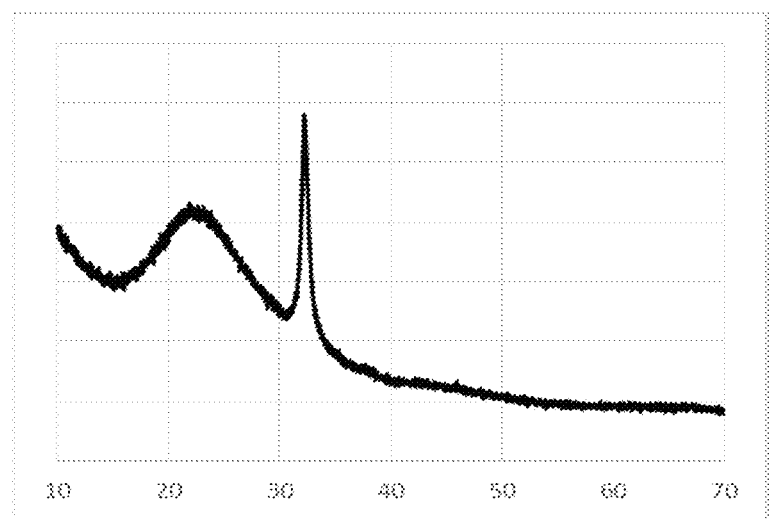
FIG. 6 shows an X-ray diffraction XRD pattern of a second metal oxide layer according to an embodiment of the present application.

As shown in FIG. 6, FIG. 6 shows an X-ray diffraction XRD pattern of the second metal oxide layer 1022 in this embodiment. In FIG. 6, a unit of abscissa is degree. In some optional embodiments, by analyzing the first metal oxide layer 1021 and the second metal oxide layer 1022 through XRD, it can be found that there is no obvious crystallization peak in the first metal oxide layer 1021, and in the XRD pattern of the second metal oxide layer 1022, a crystallization peak can be observed in a range of 29° to 32°.

Figure 7:
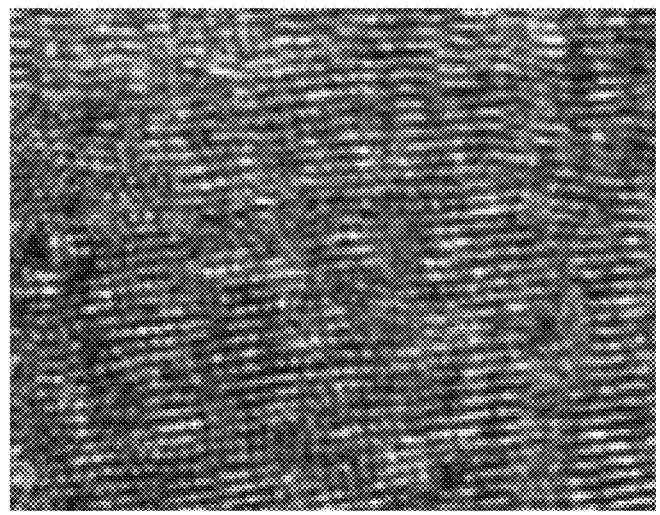
FIG. 7 is a lattice diagram of a second metal oxide layer according to an embodiment of the present application.

Further, as shown in FIG. 7, FIG. 7 is a lattice diagram of the second metal oxide layer 1022 in this embodiment. In an image of the second metal oxide layer 1022 obtained by a High Resolution Transmission Electron Microscope (HR-TEM), obvious lattice and electron diffraction spots can be observed.

In some optional embodiments, materials of the first metal oxide layer 1021 and the second metal oxide layer 1022 may include indium gallium zinc oxide (IGZO). An etching rate of the second metal oxide layer 1022 is 1 to 10 times an etching rate of the first metal oxide layer 1021 under a same etching environment.

The same etching environment refers to being in the same etching liquid or the same etching gas environment. In this embodiment, the first metal oxide layer 1021 and the second metal oxide layer 1022 include the same material, so that the etching can be performed in the same etching environment during the etching process, which helps to simplify the production process.

Further, the etching rate of the second metal oxide layer 1022 is 1 to 10 times the etching rate of the first metal oxide layer 1021. Further, in one embodiment, the etching rate of the second metal oxide layer 1022 is 6 to 10 times the etching rate of the first metal oxide layer 1021. By controlling the etching rate of the second metal oxide layer 1022 to be a higher etching rate, it can reduce adverse effects of the etching process of the second metal oxide layer 1022 on the first metal oxide layer 1021, thereby reducing the possibility of the first metal oxide layer 1021 being etched by the etching process of the second metal oxide layer 1022.

Figure 8:
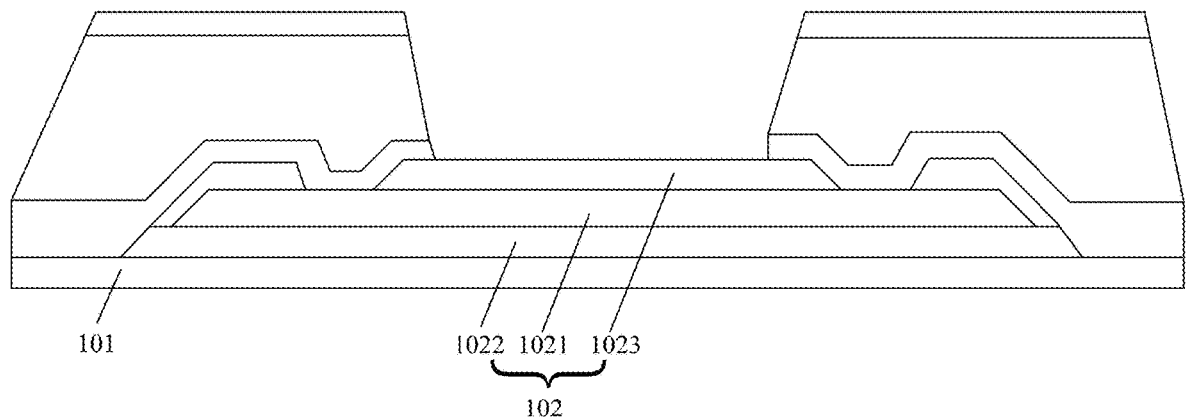
FIG. 8 is another schematic view of an oxide thin film transistor according to an embodiment of the present application.

In some optional embodiments, as shown in FIG. 8, the metal oxide active layer 102 further includes a third metal oxide layer 1023.

As shown in FIG. 8, the third metal oxide layer 1023 is located on a side of the first metal oxide layer 1021 away from the second metal oxide layer 1022. A range of an orthographic projection of the first metal oxide layer 1021 onto the third metal oxide layer 1023 is less than or equal to a range of the third metal oxide layer 1023. Since the second metal oxide layer 1022 covers the lateral surface of the first metal oxide layer 1021, it can be understood that the second metal oxide layer 1022 and the third metal oxide layer 1023 enclose the first metal oxide layer 1021 to achieve protection for the first metal oxide layer 1021, thereby reducing the possibility of the first metal oxide layer 1021 contacting other structures. This can effectively avoid influence of adverse conditions such as water and oxygen intrusion on the first metal oxide layer 1021 that implements the carrier transport function in the metal oxide active layer 102.

The material and crystallization degree of the third metal oxide layer 1023 are the same as those of the second metal oxide layer 1022, so that a bonding condition of the second metal oxide layer 1022 and the third metal oxide layer 1023 is better, which helps to improve the covering and protection effect for the first metal oxide layer 1021.

Figure 9:
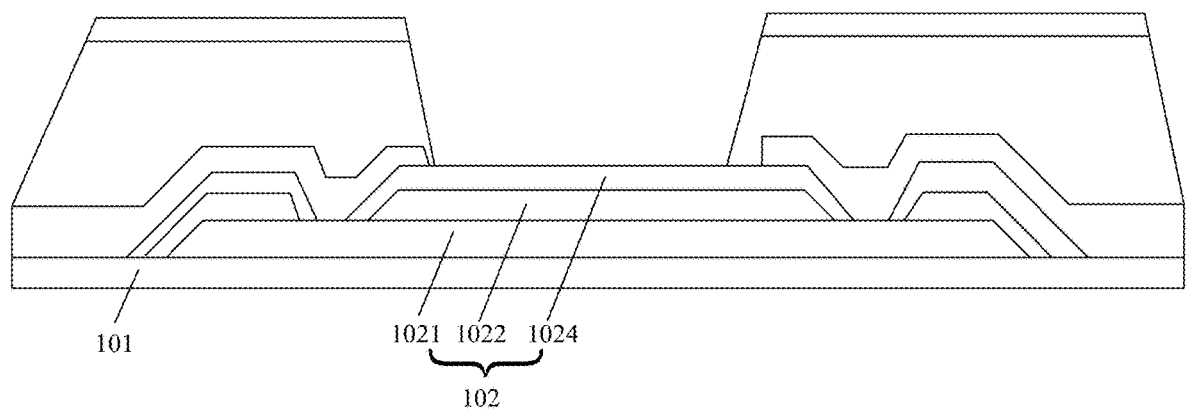
FIG. 9 is another schematic view of an oxide thin film transistor according to an embodiment of the present application.

In some optional embodiments, as shown in FIG. 9, the metal oxide active layer 102 further includes a fourth metal oxide layer 1024.

As shown in FIG. 9, the fourth metal oxide layer 1024 is located on a side of the second metal oxide layer 1022 away from the first metal oxide layer 1021. That is, the fourth metal oxide layer 1024 is located on a side of the metal oxide active layer 102 near a gate electrode of the TFT. The fourth metal oxide layer 1024 covers the lateral surface of the second metal oxide layer 1022.

The material of the fourth metal oxide layer 1024 includes IGZO, the degree of crystallization of the material of the fourth metal oxide layer 1024 is greater than that of the material of the second metal oxide layer 1022. The band gap of the fourth metal oxide layer 1024 is 3.0 to 3.5 eV.

In a case that a via hole is defined in the second metal oxide layer 1022, a via hole is also defined in a corresponding position of the fourth metal oxide layer 1024. I a case that no via hole is defined in the second metal oxide layer 1022, a via hole may be defined in the fourth metal oxide layer 1024. The presence of via holes in the fourth metal oxide layer 1024 helps to reduce an influence of the fourth metal oxide layer 1024 on the resistance between the source-drain metal layers 103 and the first metal oxide layer 1021, thereby improving the reliability of the TFT.

It should be understood that the fourth metal oxide layer 1024 serves to protect the first metal oxide layer 1021 and the second metal oxide layer 1022, and thus the fourth metal oxide layer 1024 has a carrier transfer rate lower than that of the second metal oxide layer 1022, an etching rate greater than that of the second metal oxide layer 1022, a degree of crystallization greater than that of the second metal oxide layer 1022, and a band gap greater than that of the second metal oxide layer, thereby enabling the fourth metal oxide layer 1024 to protect the second metal oxide layer 1022.

In some embodiments, the fourth metal oxide layer 1024 is a protective layer provided for the gate electrode of the TFT, and is mainly used for preventing the influence of the gate electrode on the first metal oxide layer 1021. Accordingly, when fabricating the fourth metal oxide layer 1024, the band gap of the fourth metal oxide can be adjusted accordingly to reduce the influence of carriers in the gate electrode on the first metal oxide layer 1021.

In some optional embodiments, an atomic percentage of indium in metal materials of the fourth metal oxide layer 1024 is less than an atomic percentage of indium in metal materials of the second metal oxide layer 1022.

It should be understood that in this embodiment, the materials of the second metal oxide layer 1022 and the fourth metal oxide layer 1024 are the same and may be IGZO, but proportions of different metals are different. A proportion of indium in the second metal oxide layer 1022 is greater than 20%, and a proportion of indium in the fourth metal oxide layer 1024 is less than 20%, specifically, 5% to 20% in this embodiment. In some optional embodiments, an atomic number ratio of indium, gallium and zinc in the metal materials of the fourth metal oxide layer 1024 is 2:5-8:5-8. The degree of crystallization of the fourth metal oxide layer 1024 can be increased by decreasing the atomic percentage of indium in the metal materials of the fourth metal oxide layer 1024, so that the fourth metal oxide layer 1024 has a stronger lattice order and then has a lower electron transfer rate.

In some optional embodiments, additional metal oxide layers may be provided as desired. For example, a fifth metal oxide layer having a much lower electron transfer rate may be disposed on the fourth metal oxide layer 1024 to further enhance the protection effect.

In some other optional embodiments, the first metal oxide layer 1021 has a thickness of 10 to 60 nanometers, and the second metal oxide layer 1022 has a thickness of 10 to 80 nanometers. Further, in one embodiment, a total thickness of the first metal oxide layer 1021 and the second metal oxide layer 1022 is not greater than 100 nanometers, and the thickness of the second metal oxide layer 1022 is greater than the thickness of the first metal oxide layer 1021.

One embodiment of the present application further provides a display device, which includes the foregoing oxide thin film transistor.

Since this embodiment includes all the technical solutions of the foregoing oxide thin film transistor embodiment, all the foregoing technical effects can be achieved, which will not be repeated here.

One embodiment of the present application further provides a method for manufacturing an oxide thin film transistor, including: a step of fabricating an active layer, a step of fabricating a source-drain metal layer and a step of fabricating a gate electrode. The step of fabricating the active layer, includes:

fabricating a pattern of a first metal oxide layer through a first patterning process with a target mask; and fabricating a pattern of a second metal oxide layer through a second patterning process with the target mask.

In this embodiment, a line width of the first patterning process is greater than a line width of the second patterning process; an exposure time of the first patterning process is less than an exposure time of the second patterning process; and a developing time of the first patterning process is less than a developing time of the second patterning process. An electron transfer rate of the first metal oxide layer is greater than an electron transfer rate of the carrier isolation layer.

In some embodiments, the line width of the first patterning process is greater than the line width of the second patterning process by 0.1 to 0.5 microns; the exposure time of the first patterning process is less than the exposure time of the second patterning process by 30 to 200 milliseconds; the developing time of the first patterning process is less than the developing time of the second patterning process by 1 to 10 seconds.

In this embodiment, by controlling the exposure time, developing time and line widths of the patterning process, it can use the same mask for patterning while enabling the second metal oxide layer to cover an edge of the first metal oxide layer.

Further, in the process of fabricating the pattern of the second metal oxide layer, in order to reduce the possibility that the first metal oxide layer is etched due to over-etching of the second metal oxide layer, reaction parameters may be further adjusted, such as reducing a concentration of an etching solution or reducing a supply flow of the etching gas, to reduce the etching rate. Since the etching rate of the first metal oxide layer is less than the etching rate of the second metal oxide layer, by further controlling reaction conditions, possible influences on the first metal oxide layer can be further reduced, thereby reducing the possibility of over-etching.

The above are optional embodiments of the present application. It should be pointed out that, for persons having ordinary skill in the art, several improvements and changes may be made, without departing from the principle of the present application. These improvements and changes should also be within the scope of the present application.

What is claimed is:

1. An oxide thin film transistor, comprising:
   a metal oxide active layer and a source-drain metal layer, which are on a base substrate;
   wherein the metal oxide active layer includes a first metal oxide layer and a second metal oxide layer stacked on the first metal oxide layer in a direction away from the base substrate; the first metal oxide layer is a carrier transport layer; the second metal oxide layer is a carrier isolation layer; and an electron transfer rate of the carrier transport layer is greater than an electron transfer rate of the carrier isolation layer;
   the first metal oxide layer includes a primary surface facing toward the base substrate and a primary surface away from the base substrate; the first metal oxide layer further includes a lateral surface around the primary surfaces; and the second metal oxide layer covers the lateral surface of the first metal oxide layer.

2. The oxide thin film transistor according to claim 1, wherein the source-drain metal layer is at a side of the second metal oxide layer away from the first metal oxide layer; a via hole or a blind hole is defined in the second metal oxide layer; the via hole or the blind hole extends in a direction perpendicular to the base substrate; and the source-drain metal layer is electrically coupled to the first metal oxide layer through the via hole or the blind hole.

3. The oxide thin film transistor according to claim 1, wherein the first metal oxide layer has a band gap of 2.3 to 2.8 eV; and the second metal oxide layer has a band gap of 2.8 to 3.5 eV.

4. A display device, comprising: the oxide thin film transistor according to claim 1.

5. The oxide thin film transistor according to claim 1, wherein a total thickness of the first metal oxide layer and the second metal oxide layer is not greater than 100 nanometers; and a thickness of the second metal oxide layer is greater than a thickness of the first metal oxide layer.

6. The oxide thin film transistor according to claim 5, wherein the source-drain metal layer includes a first sub-layer, a second sub-layer and a third sub-layer which are stacked on each other; the third sub-layer is electrically coupled to the first metal oxide layer.

7. The oxide thin film transistor according to claim 1, wherein a material of the first metal oxide layer includes a metal oxide in an amorphous state; and a material of the second metal oxide layer includes a metal oxide in a crystalline state.

8. The oxide thin film transistor according to claim 7, wherein the material of the second metal oxide layer has a crystallization peak in a range of 29° to 32° in an X-ray diffraction spectrogram.

9. The oxide thin film transistor according to claim 7, wherein the material of the first metal oxide layer and the material of the second metal oxide layer include indium gallium zinc oxide (IGZO).

10. The oxide thin film transistor according to claim 9, wherein the active layer further includes a third metal oxide layer; the third metal oxide layer is at a side of the first metal oxide layer away from the second metal oxide layer; a range of an orthographic projection of the first metal oxide layer onto the third metal oxide layer is less than or equal to a range of the third metal oxide layer; the third metal oxide layer has the same material and degree of crystallization as the second metal oxide layer.

11. The oxide thin film transistor according to claim 9, wherein the active layer further includes a fourth metal oxide layer; the fourth metal oxide layer is at a side of the second metal oxide layer away from the first metal oxide layer; and the fourth metal oxide layer covers a lateral surface of the second metal oxide layer in a direction perpendicular to the base substrate;
a material of the fourth metal oxide layer includes IGZO, a degree of crystallization of the material of the fourth metal oxide layer is greater than a degree of crystallization of the material of the second metal oxide layer; and the fourth metal oxide layer has a band gap of 3.0 to 3.5 eV.

12. The oxide thin film transistor according to claim 11, wherein an atomic percentage of indium in a metal material of the fourth metal oxide layer is smaller than an atomic percentage of indium in a metal material of the second metal oxide layer.

13. The oxide thin film transistor according to claim 12, wherein an atomic number ratio of indium, gallium and zinc in the metal material of the fourth metal oxide layer is 2:5-8:5-8.

14. An oxide thin film transistor, comprising:
a metal oxide active layer and a source-drain metal layer, which are on a base substrate;
wherein the metal oxide active layer includes a first metal oxide layer and a second metal oxide layer stacked on the first metal oxide layer in a direction away from the base substrate; the first metal oxide layer is a carrier transport layer; the second metal oxide layer is a carrier isolation layer; and an electron transfer rate of the carrier transport layer is greater than an electron transfer rate of the carrier isolation layer;
the source-drain metal layer is at a side of the second metal oxide layer away from the first metal oxide layer;
a via hole or a blind hole is defined in the second metal oxide layer; the via hole or the blind hole extends in a direction perpendicular to the base substrate; and the source-drain metal layer is electrically coupled to the first metal oxide layer through the via hole or the blind hole.

15. The oxide thin film transistor according to claim 14, wherein a total thickness of the first metal oxide layer and the second metal oxide layer is not greater than 100 nanometers; and a thickness of the second metal oxide layer is greater than a thickness of the first metal oxide layer.

16. The oxide thin film transistor according to claim 14, wherein the source-drain metal layer includes a first sub-layer, a second sub-layer and a third sub-layer which are stacked on each other; the third sub-layer is electrically coupled to the first metal oxide layer through the via hole or the blind hole.

17. A display device, comprising: the oxide thin film transistor according to claim 14.

18. A method of manufacturing an oxide thin film transistor, comprising:
a step of fabricating an active layer;
a step of fabricating a source-drain metal layer; and
wherein the step of fabricating the active layer, includes:
fabricating a pattern of a first metal oxide layer through a first patterning process with a target mask; and
fabricating a pattern of a second metal oxide layer through a second patterning process with the target mask;
wherein an electron transfer rate of the first metal oxide layer is greater than an electron transfer rate of the carrier isolation layer; a line width of the first patterning process is greater than a line width of the second patterning process; an exposure time of the first patterning process is less than an exposure time of the second patterning process; and a developing time of the first patterning process is less than a developing time of the second patterning process.

19. The method according to claim 18, wherein fabricating the pattern of the first metal oxide layer through the first patterning process with the target mask, and fabricating the pattern of the second metal oxide layer through the second patterning process with the target mask, includes:
controlling an etching rate of the first metal oxide layer to be less than an etching rate of the second metal oxide layer.

20. The method according to claim 18, wherein the line width of the first patterning process is greater than the line width of the second patterning process by 0.1 to 0.5 microns; and/or
the exposure time of the first patterning process is less than the exposure time of the second patterning process by 30 to 200 milliseconds; and/or
the developing time of the first patterning process is less than the developing time of the second patterning process by 1 to 10 seconds.

* * * * *